(12) United States Patent
Ogawa et al.

(10) Patent No.: US 7,193,321 B2
(45) Date of Patent: Mar. 20, 2007

(54) IC PACKAGE, INSPECTION METHOD OF IC PACKAGE MOUNTING BODY, REPAIRING METHOD OF IC PACKAGE MOUNTING BODY, AND INSPECTION PIN FOR IC PACKAGE MOUNTING BODY

(75) Inventors: Hideki Ogawa, Hino (JP); Hidenori Tanaka, Hachioji (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/940,963

(22) Filed: Sep. 15, 2004

(65) Prior Publication Data
US 2005/0211979 A1    Sep. 29, 2005

(30) Foreign Application Priority Data
Mar. 24, 2004    (JP)    ............................... 2004-086685

(51) Int. Cl.
*H01L 23/48*    (2006.01)

(52) U.S. Cl. ..................... 257/738; 438/4; 257/E21.508

(58) Field of Classification Search ................ 257/779, 257/780, 35, 774, 738, 739, 773; 438/4
See application file for complete search history.

(56) References Cited

U.S. PATENT DOCUMENTS

| | | | | |
|---|---|---|---|---|
| 5,953,592 A | * | 9/1999 | Taniguchi et al. | 438/118 |
| 6,014,318 A | * | 1/2000 | Takeda | 361/764 |
| 6,932,618 B1 | * | 8/2005 | Nelson | 439/66 |
| 2002/0117751 A1 | * | 8/2002 | Crane et al. | 257/734 |
| 2003/0214047 A1 | * | 11/2003 | Noguchi | 257/774 |

FOREIGN PATENT DOCUMENTS

JP    2003-338588    11/2003

* cited by examiner

*Primary Examiner*—Brook Kebede
*Assistant Examiner*—Su C. Kim
(74) *Attorney, Agent, or Firm*—Pillsbury Winthrop Shaw Pittman LLP

(57) ABSTRACT

Disclosed is an IC package including an interpose substrate and lands for external connection disposed on a face of the interpose substrate in a grid pattern, the interpose substrate having a penetration hole on at least a position between the lands for external connection disposed in a grid pattern. Besides, there are disclosed an inspection method of an IC package mounting body mounting this IC package, a repairing method of an IC package mounting body mounting this IC package, and an inspection pin for an IC package mounting body used for such an inspection.

3 Claims, 6 Drawing Sheets

FIG.6

IC PACKAGE, INSPECTION METHOD OF IC PACKAGE MOUNTING BODY, REPAIRING METHOD OF IC PACKAGE MOUNTING BODY, AND INSPECTION PIN FOR IC PACKAGE MOUNTING BODY

CROSS-REFERENCE TO THE INVENTION

This application is based upon and claims the benefit of priority from the prior Japanese Patent Application No. 2004-86685, filed on Mar. 24, 2004; the entire contents of which are incorporated herein by reference.

BACKGROUND

1. Field of the Invention

The present invention relates to an IC package being an outer package to package a semiconductor chip and others on a substrate and so on, an inspection method of an IC package mounting body mounting such an IC package, a repairing method of an IC package mounting body mounting such an IC package, and an inspection pin for an IC package mounting body used for such an inspection. Especially, it relates to an IC package, an inspection method of an IC package mounting body, a repairing method of an IC package mounting body, and an inspection pin for an IC package mounting body suitable for reducing the mounting failure.

2. Description of the Related Art

In an IC package, for example, in a BGA package (ball grid array package) and so on, the IC package is mounted (electrically and mechanically connected) on another substrate via solder balls provided at the IC package side. The respective processes are performed for this mounting, for example, cream solder is applied to the predetermined position of the substrate side, the IC package is positioning mounted on the corresponding position, and thereafter it is applied to a reflow furnace.

In such a packaging process, there are some typical defective modes in its electrical and mechanical connection, such as what is called a solder bridge which is a short-circuit between solder balls by soldering, and what is called an unsoldering defect in which the solder balls are not connected to the substrate side or the soldering is defectively stopped. As a method considered to be usable for repairing these defects, for example, there is a method described in the following Patent Document 1. In this disclosure, through holes provided on an interpose substrate of an IC package is used to remelt solders for repairing. These through holes are located directly above the solder balls, namely, they also are the through holes as for electrical interlayer connection.

[Patent Document 1] Japanese Patent Laid-open Application No. 2003-338588

In the disclosed art of the above-described Patent Document, there is no mention about direct detection of faulty connection preceding the repairing process. That is to say, there is only mention of malfunction of a mounted semiconductor device, or problems of a product in which the mounting body is used. Under the present circumstances, in general, it is required to confirm the connection state by using, for example, an X-ray apparatus for the direct detection of a solder bridge and so on. Incidentally, the occurrence frequency of the solder bridge is dominantly high compared to that of the unsoldering defect.

SUMMARY

The present invention is made in consideration of the above-mentioned circumstances, and an object thereof is to provide an IC package, an inspection method of a IC package mounting body, a repairing method of an IC package mounting body, and an inspection pin for an IC package mounting body capable of detecting the faulty connection easily and reducing the defects in an IC package being an outer package for packaging a semiconductor chip and others on a substrate and so on, an inspection method of an IC package mounting body mounting such an IC package, a repairing method of an IC package mounting body mounting such an IC package, and an inspection pin for an IC package mounting body used for such an inspection.

In order to solve the above-described problems, an IC package according to an aspect of the present invention includes an interpose substrate and lands for external connection disposed in a grid pattern on a face of the interpose substrate; and the interpose substrate has penetration holes on at least one position between the lands for the external connection disposed in a grid pattern. That is to say, the interpose substrate has such penetration holes, so that the defected portion such as a solder bridge which causes the occurrence of an electrical short-circuit between the lands for external connection can be directly seen from above. Therefore, an easy detection and repairing of a defect becomes possible by using this penetration hole.

Further, an inspection method of an IC package mounting body according to an aspect of the present invention includes inserting an inspection pin having two conductive pins into a penetration hole; and checking a continuity state between the two conductive pins of the inspection pin which are inserted into the penetration hole; in a mounting body in which the IC package having an interpose substrate being provided with the penetration holes on at least one position between lands for external connection disposed in a grid pattern, is mounted on a substrate via solder balls positioning at the lands for external connection. This is an inspection method of a defect applicable to a mounting body in which the above-described IC package is mounted. An inspection pin having two conductive pins is inserted into the penetration hole, and the continuity state between the two conductive pins in the inspection pin is checked, so that the presence of a solder bridge is checked. It can be judged as defective by this inspection if the continuity state is found between the conductive pins.

Further, a repairing method of an IC package mounting body according to an aspect of the present invention includes inserting a heat resistant tube into a penetration hole; and feeding hot air into the inside of the heat resistant tube inserted into the penetration hole; in a mounting body in which the IC package having an interpose substrate being provided with the penetration holes on at least one position between lands for external connection disposed in a grid pattern, is mounted on a substrate via solder balls positioning at the lands for external connection. This is a repairing method applicable to a mounting body in which the above-described IC package is mounted. The heat resistant tube is inserted into the penetration hole, and hot air is fed into the inside of the heat resistant tube, so that a solder bridge is melted and disappeared, or an unsoldering defect state is eliminated, and thereby it comes to a state that the solder exists only in its original position.

Further, a repairing method of an IC package mounting body according to another aspect of the present invention includes inserting a heat resistant tube into a penetration hole; and feeding melted solder to the position of solder balls via the inside of the heat resistant tube inserted into the penetration hole; in a mounting body in which the IC package having an interpose substrate being provided with the penetration holes on at least one position between lands for external connection disposed in a grid pattern, is mounted on a substrate via solder balls positioning at the lands for external connection. This is another repairing method applicable to a mounting body in which the above-described IC package is mounted. The heat resistant tube is inserted into the penetration hole, and melted solder is fed to the position of the solder ball via the inside of the heat resistant tube, so that the unsoldering defect is eliminated. Here, the above-described repairing method can be used at the same time. That is to say, it is the procedure that the feeding of melted solder is followed by the feeding of hot air.

Further, an inspection pin for an IC package mounting body according to an aspect of the present invention includes two conductive pins positioning substantially in parallel with each other; and a column-shaped supporting portion fixing each one side of the two conductive pins, and having an axial direction in parallel with the longitudinal direction of the two conductive pins. This is an inspection pin usable for the defect inspection of the IC package mounting body in which the above-described IC package is mounted.

According to the present invention, a faulty connection is easily detected and the defect can be reduced in an IC package being an outer package to package a semiconductor chip and others on an substrate and so on, an inspection method of an IC package mounting body mounting such an IC package, a repairing method of an IC package mounting body mounting such an IC package, and an inspection pin for an IC package mounting body used for such an inspection.

DETAILED DESCRIPTION

Description of Embodiments

Embodiments of the present invention will be described with reference to the drawings, but these drawings are presented only for the illustrative purpose and in no respect, are intended to limit the present invention.

As a mode of the present invention, the position of penetration hole is on a longitudinal line or a latitudinal line of a grid formed of lands for external connection. It is to respond to a solder bridge which is easy to be formed on the longitudinal line or the latitudinal line of the grid where the distance between adjacent solder balls is short.

Here, the penetration hole may be provided between the lands for external connection at least in the respective vicinity of the four corners of an interpose substrate. In the vicinity of the four corners of the interpose substrate are the portions where the frequency of the defect occurrence such as a solder bridge is the highest compared to other portions due to various factors. Consequently, it is disposed to respond to the defect.

Furthermore, the penetration hole may be provided between the respective lands for external connection of 3×3 grids of the lands for external connection in the respective vicinity of the four corners of the interpose substrate. The portions where the frequency of the defect occurrences such as the solder bridge is particularly high are concretely specified so as to be responded.

Further, the penetration hole may be provided between the lands for external connection at least in the vicinity of the respective edges of the interpose substrate. The vicinity of the respective edges of the interpose substrate are the portions where the frequency of the defect occurrences such as the solder bridge is high next to the vicinity of the four corners. Consequently, it is disposed to respond to the defect.

Furthermore, the penetration hole may be provided between the respective lands for external connection of the outer most row of the lands for external connection in the vicinity of the respective edges of the interpose substrate. The portions where the frequency of defect occurrences such as the solder bridge is particularly high are concretely specified so as to be responded.

Further, as a mode, the penetration hole may have a diameter of 0.5 mm or less. This size is set in view of the case that the pitch of the grid as an IC package is often set as 1.27 mm or 1.0 mm in the present circumstances. Namely, the diameter of a solder ball connected to a land for external connection should be a half as large as the pitch, and if the diameter of the penetration hole is over 0.5 mm, it becomes difficult for an inspection pin having the diameter according to the hole to pass through between the solder balls.

Further, as a mode, the penetration hole may not have a conductive layer on the internal surface thereof. It is provided as a penetration hole aside from a through hole as an electrical interlayer connection.

Figure 1A:
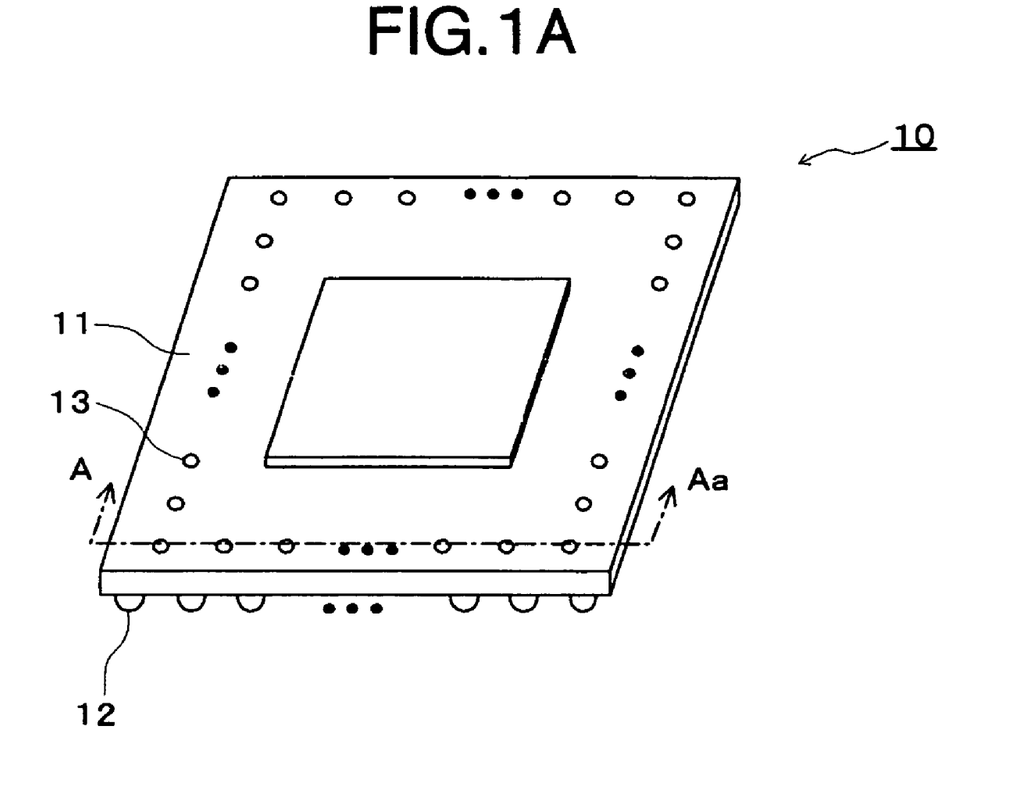
FIG. 1A and FIG. 1B are a perspective view and a sectional view each showing a constitution of an IC package according to an embodiment of the present invention.
Figure 1B:
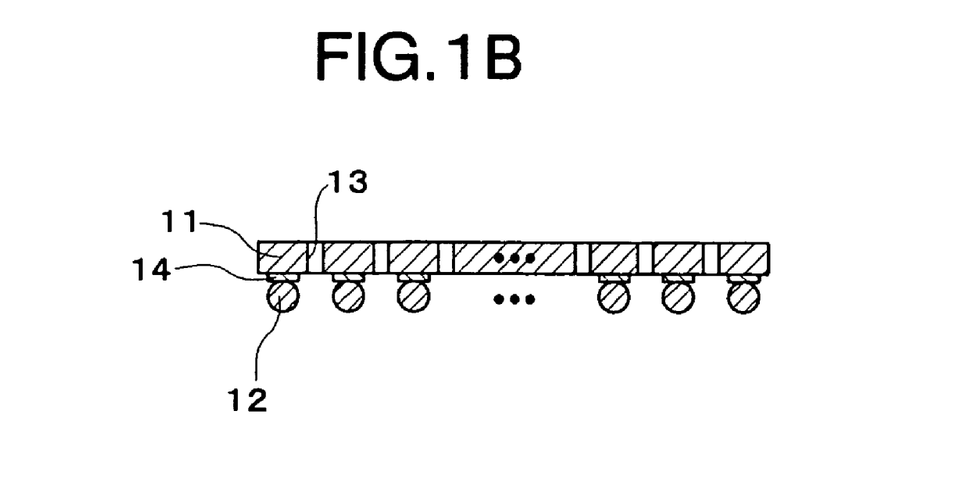

Based on the above, embodiments of the present invention will be described below with reference to the drawings. FIG. 1A and FIG. 1B are a perspective view (FIG. 1A) and a sectional view (FIG. 1B) showing a constitution of an IC package according to an embodiment of the present invention. FIG. 1B is a sectional view taken along the line A to A*a* in FIG. 1A. This IC package 10 is what is called a BGA package functioning as an outer package of a semiconductor device.

As shown in the drawings, the IC package 10 has an interposer (interpose substrate) 11, and solder balls 12 are attached in a matrix grid on one side of the interposer 11. The solder balls 12 are provided on lands for external connection 14 respectively provided on one side of the interposer 11. The interposer 11 is a base material to provide an electrical connection pattern between a not shown terminal (pad) on a semiconductor chip and the lands for external connection 14.

Further, though the interposer 11, penetration holes 13 are provided at some positions between the lands for external connection 14. As for the overall allocation of the penetration holes 13, concrete examples are further described in the embodiment described later. The penetration hole 13 may or may not have a conductive layer on the internal surface thereof. When it has the conductive layer on the internal surface, the hole is what is called a through hole for an electrical interlayer connection.

Ceramics or resin can be used as a material of the interposer 11. As a layout pitch of the land for external connection 14, 1.27 mm or 1.0 mm is often used, but a narrower pitch (fine pitch BGA) is also usable. As a relation between the layout pitch of the land for external connection 14 and the diameter of the solder ball 12, the diameter of the solder ball 12 is often set to be approximately a half as large as the layout pitch. When the layout pitch is 1.27 mm and 1.0 mm, the respective diameters of the solder balls 12 are approximately 0.64 mm and 0.5 mm. The penetration hole 13 is provided so as to detect and repair a solder bridge which is able to occur between the solder balls 12. Consequently, the diameter of the penetration hole 13 is appropriate to set to be 0.64mm or less, or 0.5 mm or less.

Incidentally, the IC package 10 of a semiconductor device having the solder balls 12 is described, but a mode in which the solder balls 12 are not attached (land grid array: LGA) is also acceptable. In the case of LGA, for example, it is possible to attach the solder balls on the wiring board side in advance and then it is mounted (electrically and mechanically connected).

Figure 2A:
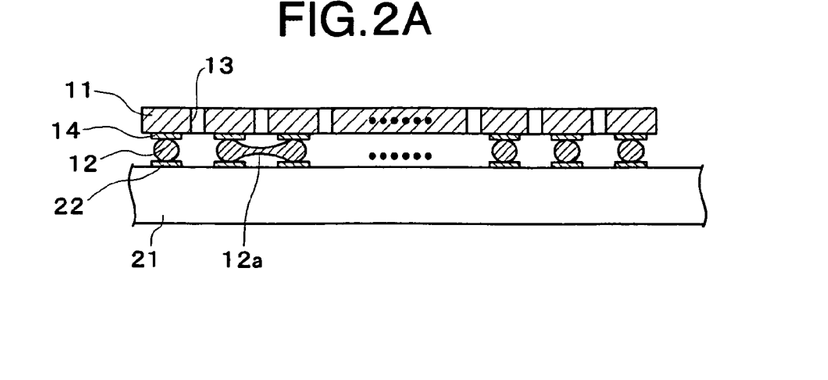
FIG. 2A, FIG. 2B, and FIG. 2C are process charts showing processes of an inspection method and a repairing method of an IC package mounting body in cross sections according to an embodiment of the present invention.
Figure 2B:
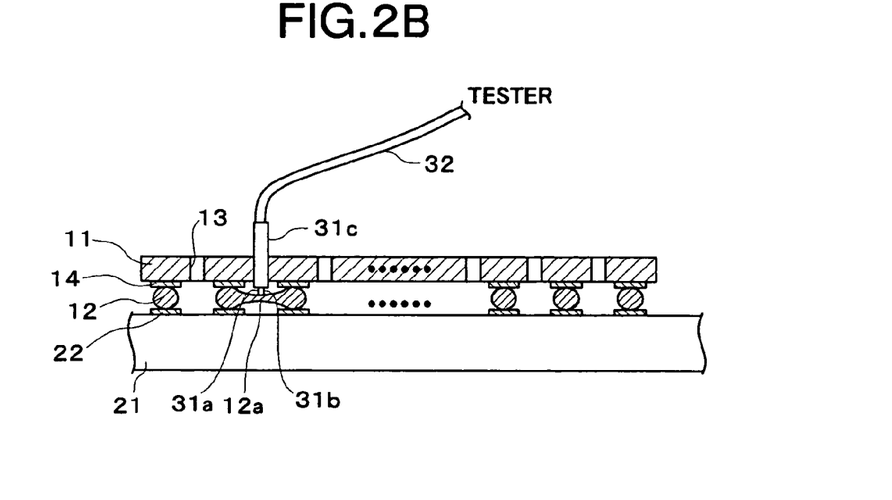
Figure 2C:
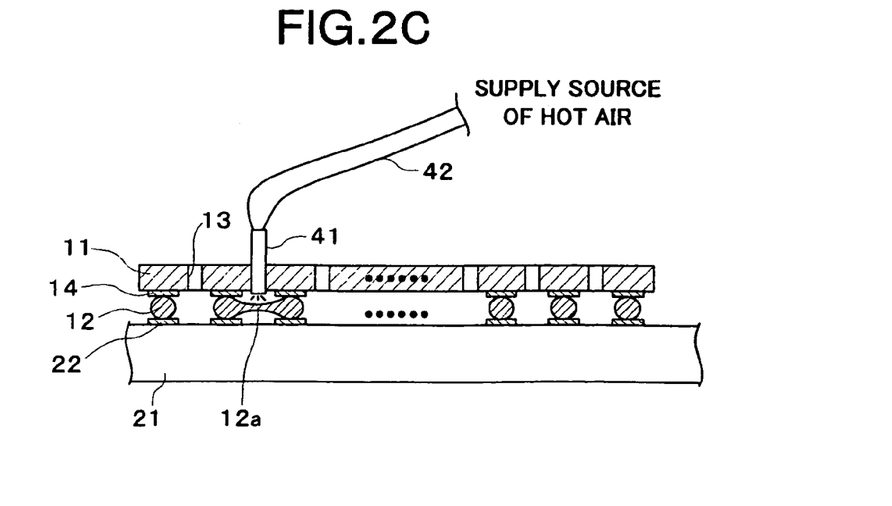

FIG. 2A, FIG. 2B, and FIG. 2C are process charts showing processes of an inspection method and a repairing method of an IC package mounting body in cross sections according to an embodiment of the present invention. In this embodiment, the inspection and repairing for the case when a solder bridge is occurred as a mounting failure are shown. In FIG. 2A, FIG. 2B, and FIG. 2C, the same reference numerals are used to designate the same elements as the elements described in FIG. 1A and FIG. 1B. The description thereof will not be given. The processes will proceed in the order of FIG. 2A, FIG. 2B, and FIG. 2C.

FIG. 2A shows a state of an IC packaged semiconductor device being mounted on a wiring board 21. The respective solder balls 12 of the semiconductor device are electrically and mechanically connected to lands 22 provided on the wiring board 21. As it is generally known, such a connection can be obtained by passing through the respective processes of, for example, cream solder being applied at the predetermined position of the wiring board 21 side, the IC packaged semiconductor device being positioning mounted at the corresponding position, and thereafter it being applied to a reflow furnace. Here, it is assumed that a solder bridge 12*a* is occurred between a part of the solder balls 12.

Next, as shown in FIG. 2B, the presence/absence of the solder bridge is checked by using the respective penetration holes 13. Specifically, an inspection pin for an IC package mounting body, having two conductive pins 31*a* and 31*b* positioned substantially in parallel with each other, and a column-shaped supporting portion 31*c* fixing each one side of the conductive pins 31*a* and 31*b*, and having the axial direction in parallel with the longitudinal direction of the conductive pins 31*a* and 31*b*, is used and the inspection pin is inserted into the respective penetration holes 13. The conductive pins 31*a* and 31*b* are electrically connected to a tester (not shown) via a conductor member 32. By checking the continuity between the conductive pins 31*a* and 31*b*, the formation of the solder bridge 12*a* can be detected. That is to say, when the continuity does not exist, the tip portions of the conductive pins 31*a* and 31*b* are considered to reach the wiring board 21, and it means that the solder bridge does not occur. When the continuity exists, the conductive pins 31*a* and 31*b* are considered to have contact with the solder bridge 12*a*.

Next, as shown in FIG. 2C, instead of the inspection pin, a heat resistant tube 41 for supplying hot air is inserted into the penetration hole 13 where the solder bridge 12*a* is detected. The heat resistant tube 41 is connected to a supply source of hot air (not shown) via a hot air supplying member 42. The heat resistant tube 41 is a tube (pipe or tube) made of, for example, metals or ceramics and having an approximately insertable diameter into the penetration hole 13. The heat resistant tube 41 is inserted into the penetration hole 13, then hot air is supplied from the supply source of hot air. Hot air has a temperature of, for example, approximately from 300° C. to 400° C. The solder bridge 12*a* is melted and made disappeared by this hot air. That is to say, when the solder bridge 12*a* is melted by hot air, the bridge is separated by the wettability of the solder to a land 14 on an interposer 11 side and the land 22 on the wiring board side and by the surface tension of melted solder.

Incidentally, after the supplying process of hot air shown in FIG. 2C, the disappearance of the solder bridge 12*a* can be confirmed by performing the continuity checking process again shown in FIG. 2B. In the inspection method of an IC package mounting body described hereinabove, simple and reliable inspection can be performed without requiring any extensive apparatus such as, for example, an X-ray apparatus to check the connection state. Besides, the penetration holes 13 can be utilized not only for inspection but also for repairing.

Figure 3A:
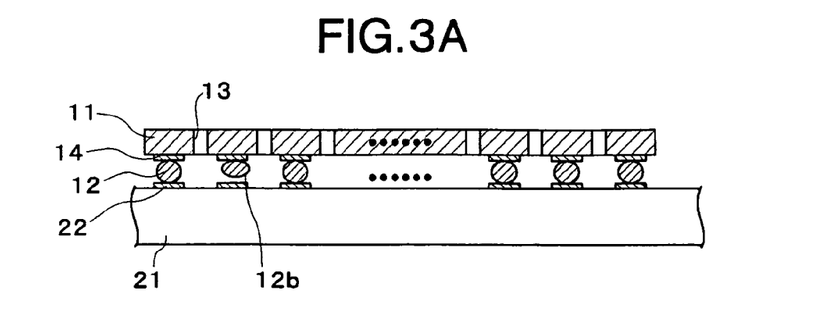
FIG. 3A, FIG. 3B, and FIG. 3C are process charts showing processes of a repairing method of an IC package mounting body in cross sections according to another embodiment of the present invention.
Figure 3B:
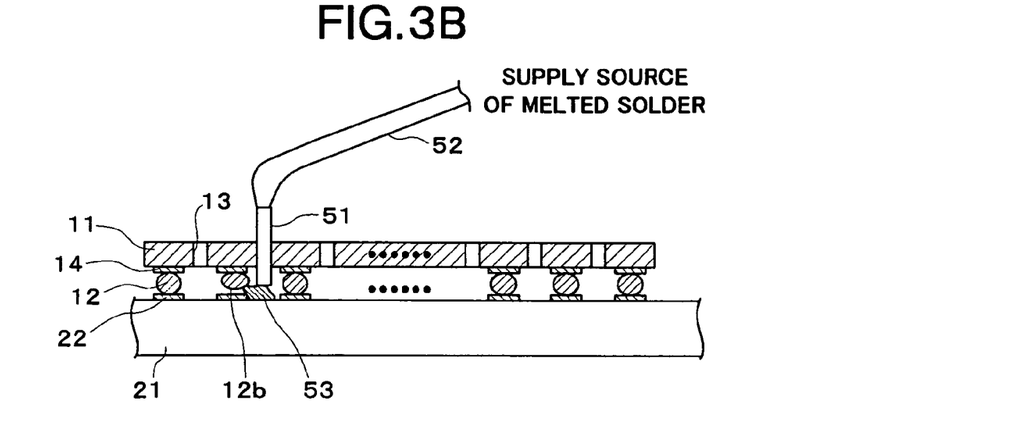
Figure 3C:
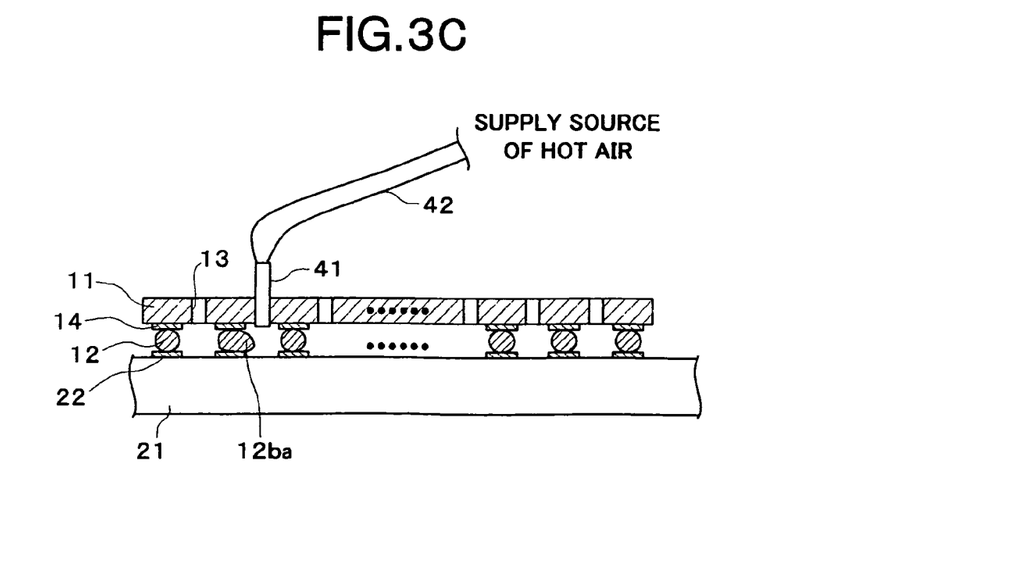

FIG. 3A, FIG. 3B, and FIG. 3C are process charts showing the processes of a repairing method of an IC package mounting body in cross sections according to another embodiment of the present invention. In this embodiment, the response for the case when an unsoldering defect is occurred as a mounting failure is shown. In FIG. 3A, FIG. 3B, and FIG. 3C, the same reference numerals are used to designate the same elements as the elements described in FIG. 1A, FIG. 1B, FIG. 2A, FIG. 2B, and FIG. 2C. The description thereof will not be given. The processes will proceed in the order of FIG. 3A, FIG. 3B, and FIG. 3C.

FIG. 3A shows a state of an IC packaged semiconductor device is mounted on a wiring board 21. The respective solder balls 12 of the semiconductor device are electrically and mechanically connected to lands 22 provided on the wiring board 21. Here, it is assumed that a solder ball 12*b* which is unsoldered is occurred in a part of the solder balls 12.

Next, as shown in FIG. 3B, a heat resistant tube 51 for supplying melted solder 53 is inserted into a penetration hole 13 in the vicinity of the unsoldered solder ball 12*b*. The heat resistant tube 51 is connected to a supply source of melted solder (not shown) via a melted solder supplying member 52. The heat resistant tube 51 is a tube (pipe or tube) made of, for example, metals or ceramics, and having an approximately insertable diameter into the penetration hole 13. The heat resistant tube 51 is inserted into the penetration hole 13, then melted solder 53 is fed from the supply source of the melted solder in the vicinity of the solder ball 12*b*. Hereby, the unsoldered solder ball 12*b* can be improved to a normal connection state because the wettability of the solder at a land 14 on a interposer 11 side and at the land 22 on the wiring board side is exhibited and the surface tension of melted solder 53 is existing.

After the process shown in FIG. 3B, hot air may further be supplied as shown in FIG. 3C. The process in FIG. 3C is the same as the process described with reference to FIG. 2C. By the supplying process of hot air shown in FIG. 3C, the wettability of the solder to the land 14 of the interposer 11 side and the land 22 on the wiring board side and the surface tension of melted solder are further exhibited, and a form of a solder ball 12ba being dissolved the unsoldering defect can further be adjusted. In the above-described repairing method of an IC package mounting body, the repairing of the unsoldering defect can be performed by using the penetration hole 13.

Next, concrete examples of overall allocations of the penetration holes 13 in an IC package is described with reference to FIG. 4 to FIG. 6. In these drawings, the same reference numerals are used to designate the same elements as the elements described in FIG. 1A and FIG. 1B. The description thereof will not be given except for the case of any addition.

Figure 4:
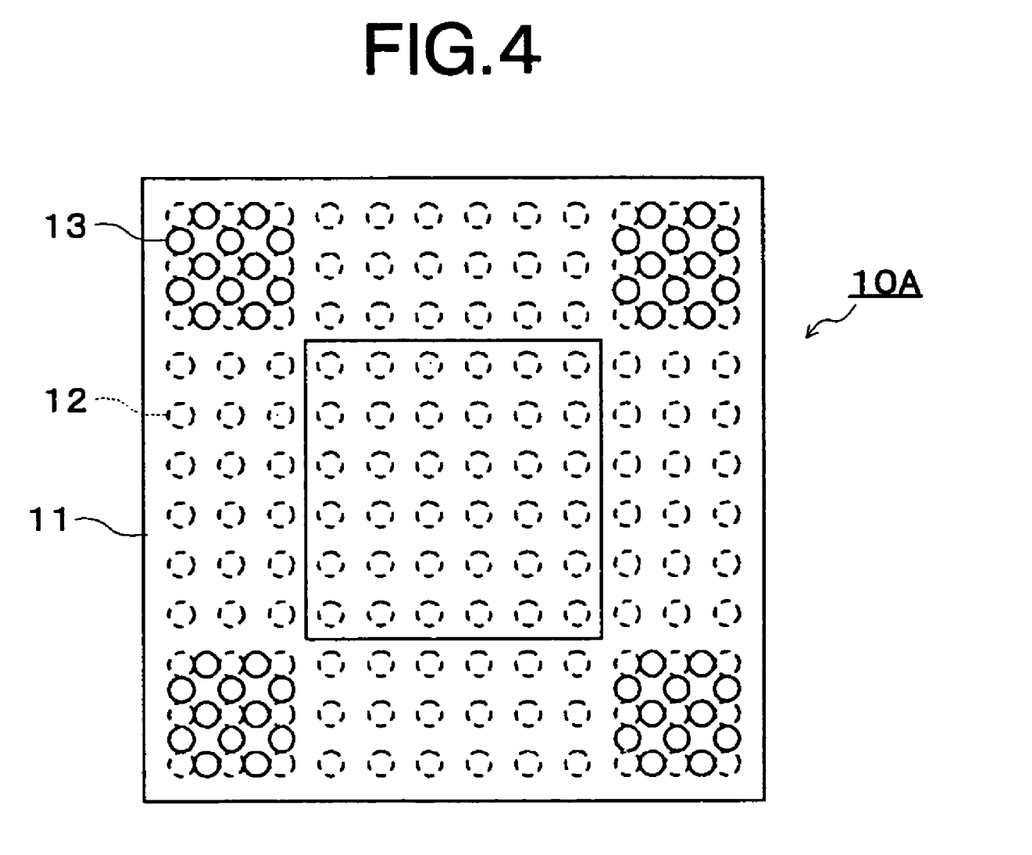
FIG. 4 is a plan view showing a constitution of an IC package according to another embodiment of the present invention.

FIG. 4 is a plan view showing a constitution of an IC package according to another embodiment of the present invention. In an IC package 10A of this embodiment, 12 holes of the penetration holes 13 are allocated in the vicinity of four corners of an interposer 11. More concretely, the positions are on the longitudinal line or the latitudinal line of a grid formed of solder balls 12 (land for external connection), and the holes are provided between the respective solder balls 12 of the 3×3 grids of the respective solder balls 12 in the vicinity of the four corners of the interposer 11.

The reason why the penetration holes 13 are provided only in the vicinity of the four corners of the interposer 11 is to respond to the faulty connection such as a solder bridge which is easy to occur in this area compared to other areas. As one cause of such a defect occurrence, the curvature of the interposer 11 which may occur especially when it is made of resin, can be cited. During the mounting process, the vicinity of the four corners are the most influenced areas by the curvature in the meaning of distance between the interposer 11 and a wiring board to be mounted. Besides, around the middle area of the interposer 11, the respective solder balls 12 are evenly influenced by the solder balls 12 from four directions during the mounting process, but in the vicinity of the respective edges, the influence from one direction does not exist, and moreover, in the vicinity of the four corners, the influences from three directions among the four directions do not exist, and therefore the balance is broken.

Incidentally, it can be considered that the penetration holes 13 are provided at the face-centered grid, but the shorter the distance between the solder balls 12, the easier the solder bridge is formed. So it is considered to be expedient that the penetration holes 13 are to be provided on the longitudinal line or the latitudinal line of the grid formed of the solder balls 12. Here, the example of the IC package 10A having 144 terminals of 12×12 in the number of terminals is shown, but other number of terminals are of course acceptable (it is the same as above in FIG. 5 and FIG. 6 later described). In any case, the target grid where the penetration holes 13 are disposed can be set as 2×2, 4×4, and so on, other than 3×3.

Figure 5:
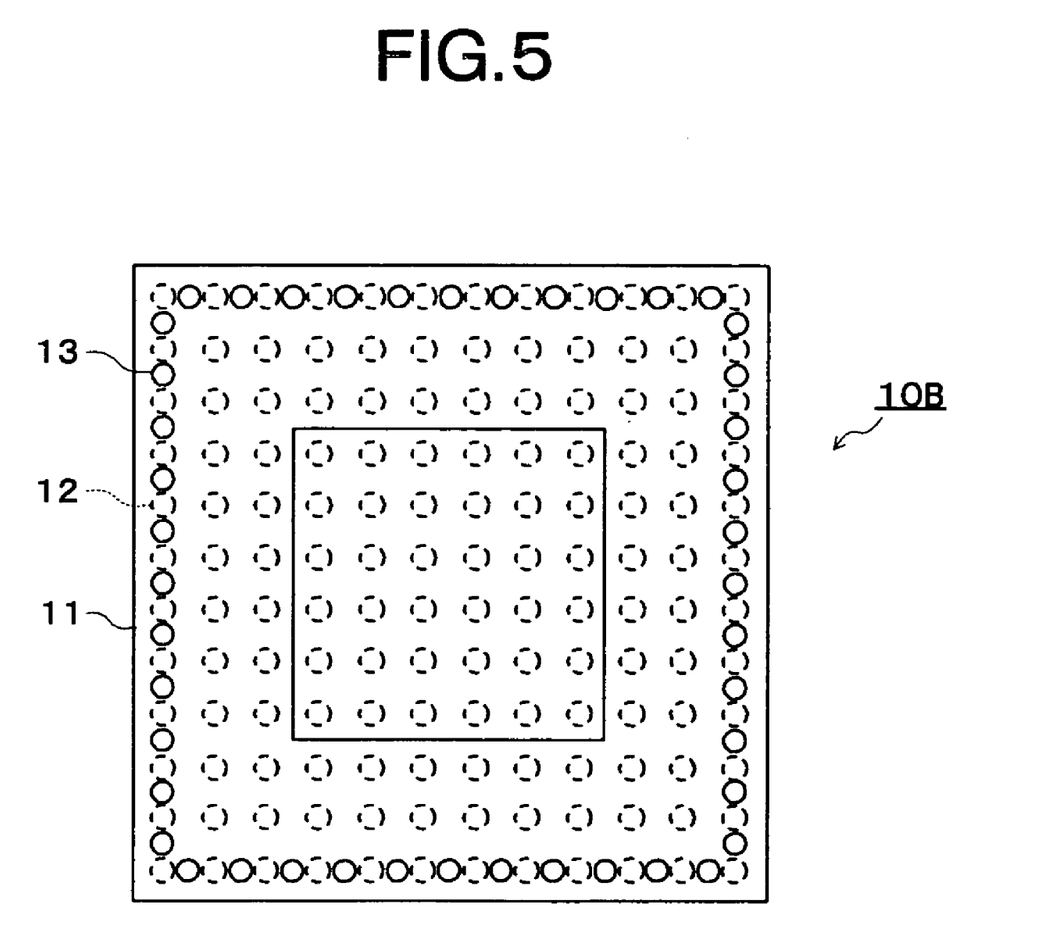
FIG. 5 is a plan view showing a constitution of an IC package according to still another embodiment of the present invention.

FIG. 5 is a plan view showing a constitution of an IC package according to still another embodiment of the present invention. In an IC package 10B of this embodiment, the penetration holes 13 are allocated between the respective solder balls 12 in the vicinity of the respective edges of the solder balls 12 in an interposer 11. More concretely, the positions are on the longitudinal line or the latitudinal line of the grid formed of the solder balls 12 (land for external connection), and the holes are provided between the respective solder balls 12 which are disposed at the outer most row of the solder balls 12.

The reason why such an allocation of the penetration holes 13 is selected is because the faulty connection such as a solder bridge is easy to be occur in the vicinity of the respective edges as it is already described. Incidentally, as a further modification example, the target for the allocation of the penetration holes 13 is not limited to the one row at the outer most, but it can be set as two rows, three rows, and so on. Besides, it can also be considered that the allocation of the penetration holes 13 is restrained in the vicinity of the center of the respective edges, not to set all of the long direction of the respective edges as the target for the allocation of the penetration holes 13. The reason for this is the same as is above-described one.

Figure 6:
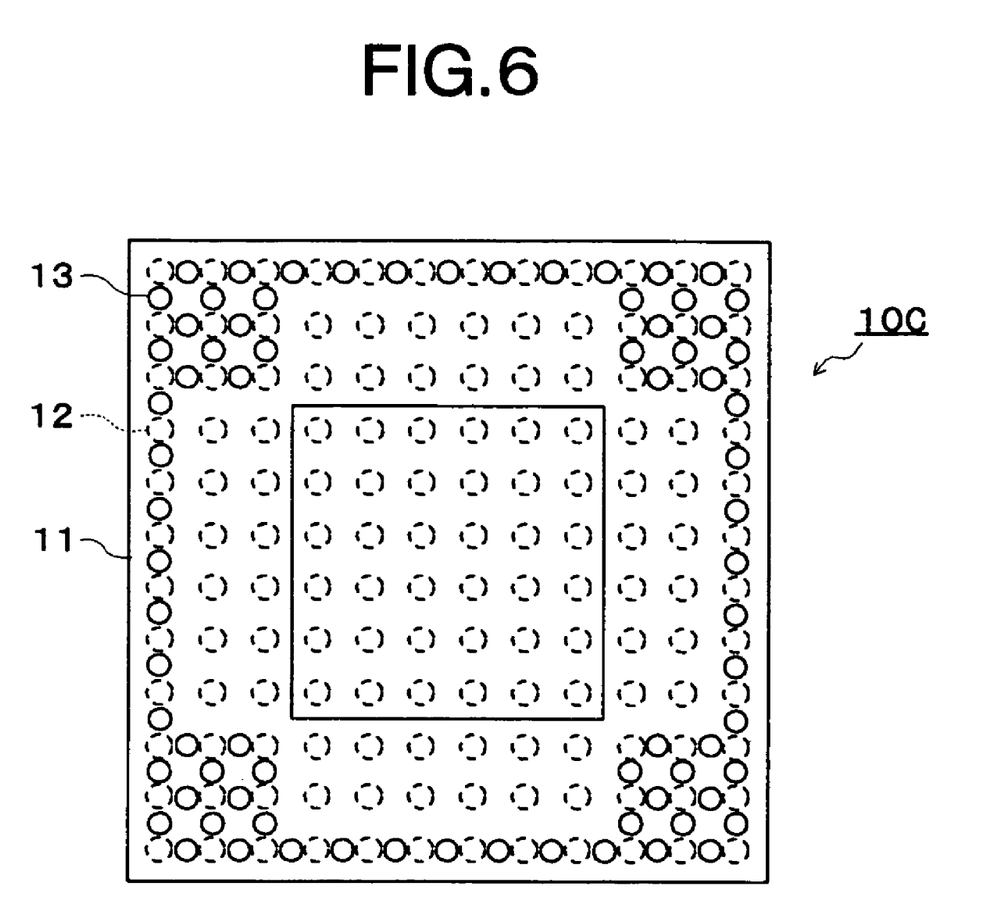
FIG. 6 is a plan view showing a constitution of an IC package according to yet another embodiment of the present invention.

FIG. 6 is a plan view showing a constitution of an IC package according to yet another embodiment of the present invention. In an IC package 10C of this embodiment, the allocation of penetration holes 13 is an adding form of the allocations in the embodiment shown in FIG. 4 and in the embodiment shown in FIG. 5. Accordingly, the effect can be obtained superimposedly. A modification example in this case can be constituted by referring to the respective modification examples described in FIG. 4 and FIG. 5 accordingly.

The present invention is not limited to the specific forms described here with the illustrations, but it is to be understood that all the changes and modifications without departing from the range of the following claims are to be included therein.

What is claimed is:

1. An IC package comprising:
   an interpose substrate; and lands for external connection disposed in a grid pattern on a face of the interpose substrate;
   wherein the interpose substrate has at least one penetration hole located between one of the lands and another one of the lands adjacent to the one of the lands, the position of the penetration hole being on a longitudinal line or a latitudinal line of the grid pattern formed of the lands, the penetration hole being provided at least in a vicinity of respective four corners of the interpose substrate, and each of the one of the lands and the other one of the lands belonging to 3×3 grids of the lands in the vicinity of the respective four corners of the interpose substrate.

2. An IC package comprising:
   an interpose substrate; and
   lands for external connection disposed in a grid pattern on a face of the interpose substrate;
   wherein the interpose substrate has at least one penetration hole located between one of the lands and another one of the lands adjacent to the one of the lands, the position of the penetration hole being on a longitudinal line or a latitudinal line of the grid pattern formed of the lands, the penetration hole being provided at least in a vicinity of respective edges of the interpose substrate, and each of the one of the lands and the other one of the lands belonging to an outermost row among the lands in the vicinity of the respective edges of the interpose substrate.

3. The IC package according to claim 2, wherein the penetration hole is also provided at least in a vicinity of respective four corners of the interpose substrate, each of the one of the lands and the other one of the lands belonging to 3×3 grids of the lands in the vicinity of respective four corners of the interpose substrate.

* * * * *